(12) United States Patent
Higashiuchi et al.

(10) Patent No.: US 9,634,210 B2
(45) Date of Patent: Apr. 25, 2017

(54) OPTICAL SEMICONDUCTOR DEVICE PRODUCTION METHOD AND OPTICAL SEMICONDUCTOR DEVICE

(71) Applicant: HITACHI CHEMICAL COMPANY, LTD., Tokyo (JP)

(72) Inventors: Tomoko Higashiuchi, Tsukuba (JP); Nobuaki Takane, Tsukuba (JP); Masashi Yamaura, Tsukuba (JP); Maki Inada, Tsukuba (JP); Hiroshi Yokota, Chikusei (JP)

(73) Assignee: HITACHI CHEMICAL COMPANY, LTD, Tokyo (JP)

( * ) Notice: Subject to any disclaimer, the term of this patent is extended or adjusted under 35 U.S.C. 154(b) by 0 days.

(21) Appl. No.: 14/405,933

(22) PCT Filed: Jun. 6, 2013

(86) PCT No.: PCT/JP2013/065687
§ 371 (c)(1),
(2) Date: Dec. 5, 2014

(87) PCT Pub. No.: WO2013/183705
PCT Pub. Date: Dec. 12, 2013

(65) Prior Publication Data
US 2015/0194584 A1 Jul. 9, 2015

(30) Foreign Application Priority Data

Jun. 6, 2012 (JP) .................................. 2012-129141

(51) Int. Cl.
*H01L 21/00* (2006.01)
*H01L 33/62* (2010.01)
(Continued)

(52) U.S. Cl.
CPC ............ *H01L 33/62* (2013.01); *H01L 33/486* (2013.01); *H01L 33/52* (2013.01); *H01L 33/60* (2013.01);
(Continued)

(58) Field of Classification Search
CPC .......... H01L 21/56; H01L 33/52; H01L 33/60
(Continued)

(56) References Cited

U.S. PATENT DOCUMENTS 8,883,048 B2 * 11/2014 Hashimoto ............ C08G 69/26
252/582
9,112,122 B2 * 8/2015 Hatano ............... C09K 11/7774
2007/0027248 A1 2/2007 Ebina et al.

FOREIGN PATENT DOCUMENTS

CN 1446252 A 10/2003
CN 104053818 A 9/2014
(Continued)

OTHER PUBLICATIONS

Notification of Transmittal of Translation of the International Preliminary Report on Patentability mailed Dec. 18, 2014, for International Application No. PCT/JP2013/065687.
(Continued)

*Primary Examiner* — Tan N Tran
(74) *Attorney, Agent, or Firm* — Fitch, Even, Tabin & Flannery, LLP

(57) ABSTRACT

There is provided a production method for an optical semiconductor device including a substrate having a silver plating layer formed on a surface and a light emitting diode bonded to the silver plating layer. The production method includes a film formation step of forming a clay film covering the silver plating layer and a connection step of
(Continued)

electrically connecting the light emitting diode and the silver plating layer covered with the clay film by wire bonding, after the film formation step.

6 Claims, 15 Drawing Sheets

(51) Int. Cl.
  *H01L 33/60* (2010.01)
  *H01L 33/48* (2010.01)
  *H01L 33/52* (2010.01)
  *H01L 33/44* (2010.01)

(52) U.S. Cl.
  CPC .... *H01L 33/44* (2013.01); *H01L 2224/48091* (2013.01); *H01L 2224/73265* (2013.01); *H01L 2224/8592* (2013.01); *H01L 2933/0033* (2013.01); *H01L 2933/0066* (2013.01)

(58) Field of Classification Search
  USPC ............................ 257/98, 99, 100; 438/22
  See application file for complete search history.

(56) References Cited

FOREIGN PATENT DOCUMENTS

| | | |
|---|---|---|
| JP | 2008-010591 | 1/2008 |
| JP | 2008-041706 | 2/2008 |
| JP | 2009-170825 | 7/2009 |
| JP | 2009-224538 | 10/2009 |
| JP | 2010-239043 | 10/2010 |
| JP | 2011-009143 | 1/2011 |
| WO | WO 2005/023714 | 3/2005 |
| WO | WO 2007/015426 | 2/2007 |
| WO | WO 2010/074038 | 7/2010 |

OTHER PUBLICATIONS

International Search Report mailed Aug. 6, 2013, for International Application No. PCT/JP2013/065687.
Office Action mailed May 30, 2016, for Chinese Application No. 201380029860.1.
Office Action mailed Feb. 13, 2017, for Chinese Application No. 201380029860.1.

* cited by examiner

Fig.10

| ITEM | NUMBER OF TIMES OF DROPPING | THICKNESS [μm] | TENSION LOAD (PULL STRENGTH) [gf] | CONDUCTION RESISTANCE VALUE [Ω] |
|---|---|---|---|---|
| COMPARATIVE EXAMPLE | — | — | 7.7 | 0.2 |
| FIRST EXAMPLE | 5 | 0.7 | 5.2 | 0.2 |
| SECOND EXAMPLE | 10 | 1.8 | 5.8 | 0.3 |

# OPTICAL SEMICONDUCTOR DEVICE PRODUCTION METHOD AND OPTICAL SEMICONDUCTOR DEVICE

TECHNICAL FIELD

The present invention relates to a production method for an optical semiconductor device including a light emitting diode and an optical semiconductor device.

BACKGROUND ART

Conventionally, an optical semiconductor device including a light emitting diode (LED) described in the following PTL 1 has been known. The optical semiconductor device includes an LED which is a light emitting element and a molding to place the LED. The molding has a first lead electrically connected to one electrode of the LED and a second lead electrically connected to another electrode of the LED through wire. In addition, the molding has a concave portion with a bottom surface and lateral surfaces on which the LED is placed and a sealing member to seal the LED is filled into the concave portion. Because the molding has high reflectance, transmittance of light for the lateral surfaces and the bottom surface of the concave portion decreases and the light is efficiently emitted from the LED.

CITATION LIST

Patent Literature

Patent Literature 1: PCT2007/015426

SUMMARY OF INVENTION

Technical Problem

In the electrodes of the optical semiconductor device, a silver plating layer may be formed, for example. The silver plating layer is corroded by gas contained in an atmosphere and a color thereof changes. When the optical semiconductor device having the silver plating layer is used as an illumination instrument, there is a problem in that illuminance decreases earlier than an operation guarantee time of the LED. Particularly, if the silver plating layer formed in the electrodes is sulfurated by hydrogen sulfide gas, a color of the electrodes changes to a black color. Therefore, reflectance in the electrodes decreases and illuminance of the optical semiconductor device decreases. In addition, if the light emitting element has high power, an amount of heat emitted from the light emitting element increases and a temperature of the electrode increases. The increase in the temperature of the electrode may accelerate sulfuration of the silver plating layer formed in the electrode.

In the past, a thermoplastic resin is used as a resin forming the molding. Because a color of the thermoplastic resin changes earlier than the color change of the silver plating layer, an influence which the color change of the silver plating layer accounts for as a cause of the illuminance decrease of the optical semiconductor device is small. However, instead of the thermoplastic resin, a thermosetting resin is used in the molding recently. A color change of the thermosetting resin appears later than the color change of the silver plating layer. For this reason, an influence which the color change of the silver plating layer accounts for as the cause of the illuminance decrease of the optical semiconductor device is large. Furthermore, there is a movement to standardize an evaluation of the hydrogen sulfide gas for the optical semiconductor device.

Accordingly, an object of the present invention is to provide a production method for an optical semiconductor device that can suppress sulfuration of a silver plating layer and the optical semiconductor device.

According to one embodiment of the present invention, there is provided a production method for an optical semiconductor device including a substrate having a silver plating layer formed on a surface and a light emitting diode bonded to the silver plating layer, and the production method includes: a film formation step of forming a clay film covering the silver plating layer; and a connection step of electrically connecting the light emitting diode and the silver plating layer covered with the clay film by wire bonding, after the film formation step.

Solution to Problem

According to the production method for the optical semiconductor device according to one embodiment of the present invention, because the silver plating layer is covered with the clay film having a gas barrier in the film formation step, sulfuration of the silver plating layer can be suppressed. Thereby, illuminance of the optical semiconductor device can be suppressed from being decreased due to a color change of the silver plating layer. In addition, in the connection step, the wire bonding is performed, so that the bonding wire having penetrated the clay film can be electrically connected to the silver plating layer and conduction of the silver plating layer and the light emitting diode can be secured. In addition, according to the production method for the optical semiconductor device according to the present invention, the connection step is executed after the film formation step, so that the wire bonding is performed after the clay film is formed. Therefore, the bonding wire that is not affected by the film formation step can be obtained. Because the film formation step is executed in a state in which there is no bonding wire, the clay film can be surely formed on the silver plating layer.

In one embodiment of the present invention, in the film formation step, after a clay diluted solution obtained by diluting clay with a solvent from the surface side of the substrate is applied to the silver plating layer, the clay diluted solution may be dried and the clay film may be formed. According to the clay diluted solution, because an application amount for the surface side of the substrate or a ratio of the clay for the solvent can be adjusted, the thickness of the clay film can be controlled. Thereby, the clay film having the predetermined thickness can be easily formed. Because the film formation step is executed before the connection step, the clay diluted solution is not attached to the bonding wire. Therefore, unnecessary stress can be prevented from being applied from the clay to the bonding wire and fracturing of the bonding wire can be suppressed.

One embodiment of the present invention may further include a bonding step of bonding the light emitting diode to the silver plating layer of the substrate, before the film formation step. According to this step, because the clay film does not exist on the silver plating layer when the bonding step is executed, the light emitting diode can be easily bonded to the silver plating layer.

One embodiment of the present invention may further include a bonding step of bonding the light emitting diode to the silver plating layer of the substrate, between the film formation step and the connection step. According to this step, because the clay film is not formed on the surface of the light emitting diode, the wire bonding can be easily performed for the electrode of the light emitting diode.

In one embodiment of the present invention, a thickness of the clay film may be 0.01 μm to 500 μm. According to the thickness of the clay film, cracks can be suppressed from occurring in the clay film, a gas barrier can be secured, and transparency of the clay film can be secured.

In one embodiment of the present invention, in the connection step, a load applied to a capillary may be set as 60 gf to 150 gf and bonding wire may be pressed to the silver plating layer covered with the clay film. If the load is set, the bonding wire can be made to penetrate the clay film and the bonding wire can be surely connected to the silver plating layer.

In one embodiment of the present invention, in the connection step, the capillary may be vibrated and the bonding wire may be pressed to the silver plating layer covered with the clay film. By vibrating the capillary, the bonding wire can be made to penetrate the clay film and the bonding wire can be more surely connected to the silver plating layer.

An optical semiconductor device according to one embodiment of the present invention includes a substrate that has a silver plating layer formed on a surface, a light emitting diode that is bonded to the silver plating layer, a clay film that covers the silver plating layer, and bonding wire that has a first connecting portion wire-bonded to the light emitting diode and the silver plating layer and electrically connected to the light emitting diode, a second connecting portion electrically connected to the silver plating layer, and an extension portion extending from the first connecting portion to the second connecting portion. The extension portion is exposed from the clay film.

In the optical semiconductor device according to one embodiment of the present invention, because the silver plating layer is covered with the clay film having a gas barrier property, sulfuration of the silver plating layer can be suppressed. Thereby, illuminance of the optical semiconductor device can be suppressed from being decreased due to a color change of the silver plating layer. In addition, because the bonding wire is connected to the silver plating layer by the wire bonding, conduction of the silver plating layer and the light emitting diode can be secured. In addition, because the extension portion of the bonding wire is exposed from the clay film and the clay film is not attached to the extension portion, the unnecessary stress can be prevented from being applied from the clay film to the bonding wire. Therefore, the fracturing of the bonding wire can be prevented.

In one embodiment of the present invention, the second connecting portion may include a connection surface that contacts the silver plating layer and an exposure surface that exists at the side opposite to the connection surface and the exposure surface may be exposed from the clay film. According to this configuration, because the connection surface of the second connecting portion contacts the silver plating layer, conduction can be secured between the bonding wire and the silver plating layer. In addition, because the exposure surface is exposed from the clay film and the clay film is not attached onto the exposure surface, unnecessary stress can be prevented from being applied from the clay film to the bonding wire. Therefore, fracturing of the bonding wire can be further suppressed.

One embodiment of the present invention may further include a light reflecting portion that is arranged on the substrate and surrounds the light emitting diode and a transparent sealing portion that is filled into a space formed by the light reflecting portion and the substrate and seals the light emitting diode and the extension portion may contact the transparent sealing portion. According to this configuration, because the extension portion directly contacts the transparent sealing portion, the clay film does not exist between the extension portion and the transparent sealing portion. Therefore, because the unnecessary stress can be prevented from being applied from the clay film to the extension portion, the fracturing of the bonding wire can be suppressed. In addition, because the extension portion contacts the transparent sealing portion, the extension portion can be protected.

In one embodiment of the present invention, the second connecting portion may include a connection surface that contacts the silver plating layer and an exposure surface that exists at the side opposite to the connection surface and the exposure surface may contact the transparent sealing portion. Because the second connecting portion directly contacts the transparent sealing portion, the clay film does not exist between the second connecting portion and the transparent sealing portion. Therefore, because the unnecessary stress can be prevented from being applied from the clay film to the second connecting portion, the fracturing of the bonding wire can be suppressed. In addition, because the second connecting portion contacts the transparent sealing portion, the second connecting portion can be protected.

Advantageous Effects of Invention

According to the present invention, a production method for an optical semiconductor device that can prevent sulfuration of a silver plating layer, suppress fracturing of bonding wire, and secure conduction of the silver plating layer and a light emitting diode and the optical semiconductor device are provided.

BRIEF DESCRIPTION OF DRAWINGS

FIG. 10 is a diagram illustrating conditions and evaluation results of a comparative example and first and second examples.

DESCRIPTION OF EMBODIMENTS

Figure 1:
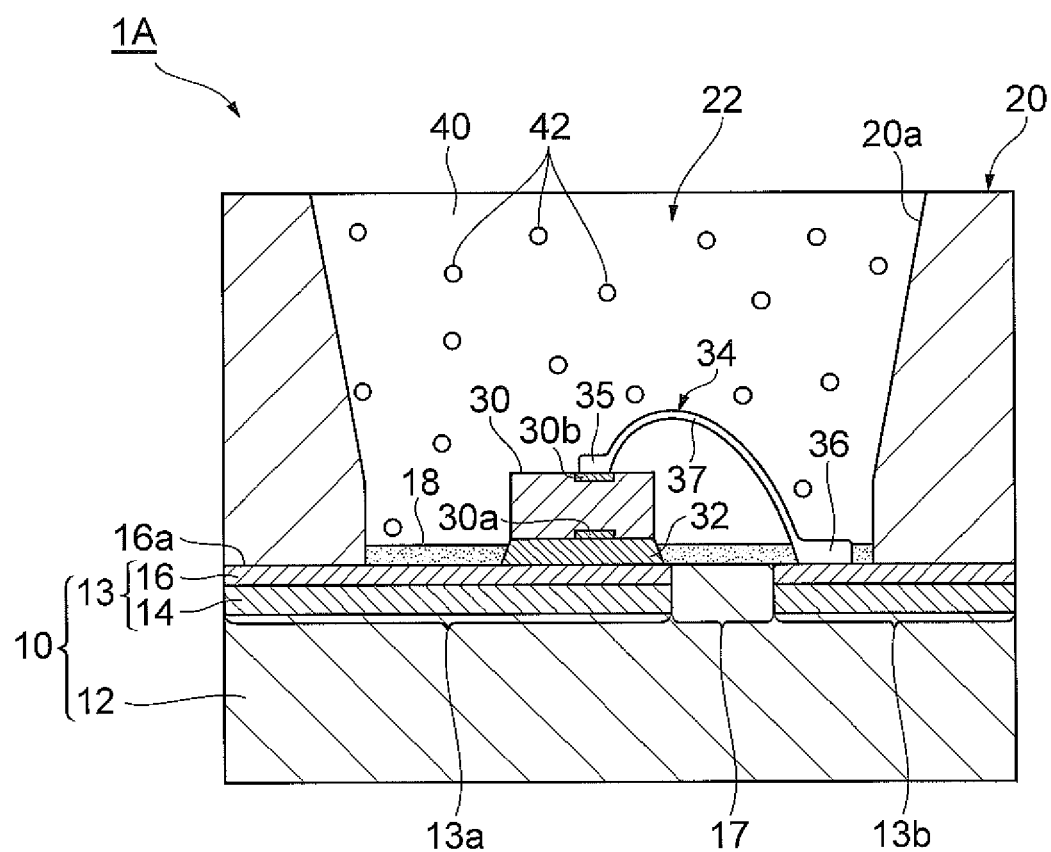
FIG. 1 is a diagram illustrating a cross section of an optical semiconductor device according to a first embodiment.

Hereinafter, preferred embodiments of an optical semiconductor device according to the present invention will be described in detail with reference to the drawings. In all drawings, the same or corresponding portions are denoted with the same reference numerals.

First Embodiment

Figure 2:
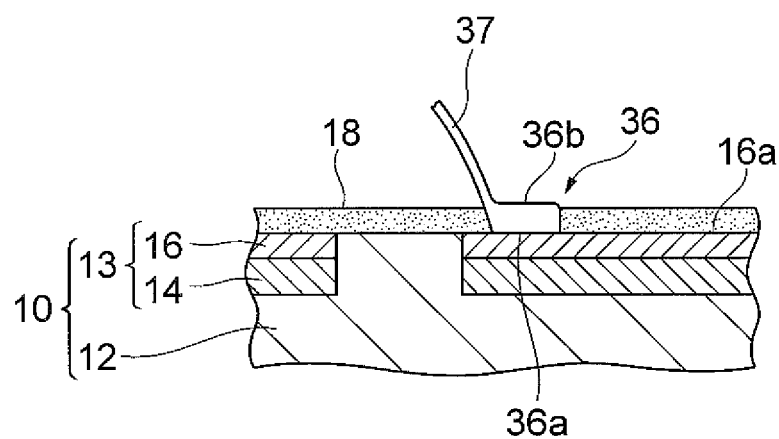
FIG. 2 is a diagram illustrating a partially enlarged cross section of the optical semiconductor device illustrated in FIG. 1.
Figure 3:
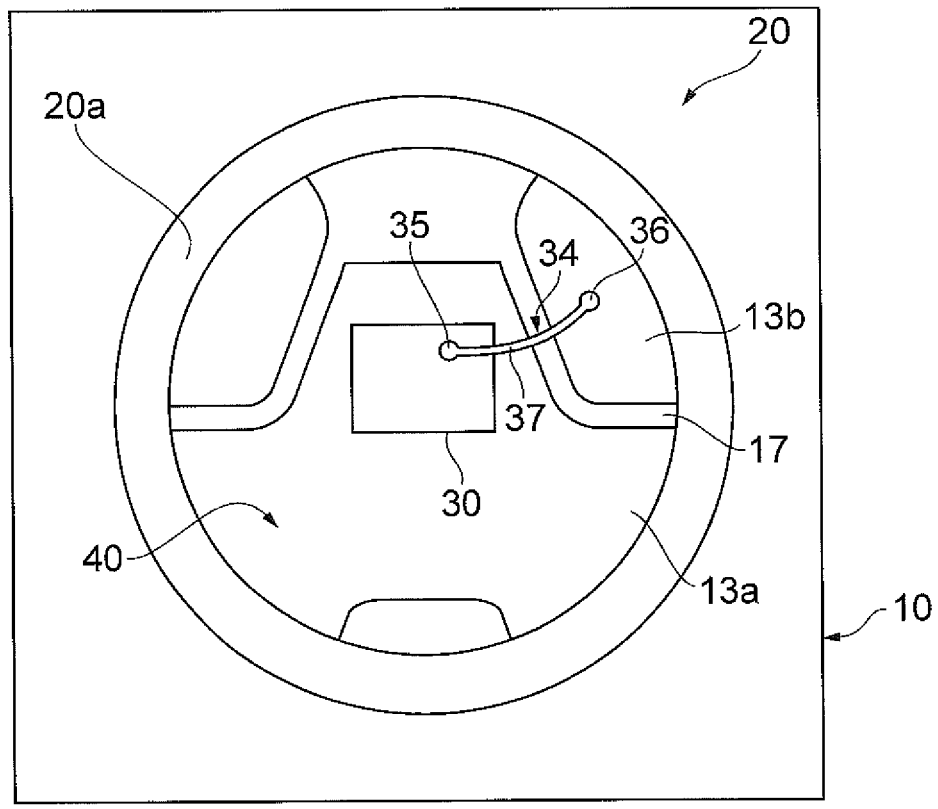
FIG. 3 is a plan view of the optical semiconductor device illustrated in FIG. 1.

An optical semiconductor device according to a first embodiment will be described. FIG. 1 is a diagram illustrating a cross section of the optical semiconductor device according to the first embodiment. FIG. 2 is a partially enlarged view of FIG. 1. FIG. 3 is a plan view of the optical semiconductor device illustrated in FIG. 1. An optical semiconductor device 1A according to the first embodiment includes a substrate 10, a blue LED 30 that is a light emitting diode bonded to an upper side of the substrate 10, bonding wire 34 that applies a voltage to the blue LED 30, a reflector 20 that is a light reflecting portion arranged on the substrate 10 to surround the blue LED 30, and a transparent sealing resin 40 that is a transparent sealing portion filled into an internal space of the reflector 20.

The substrate 10 has an insulating base 12 and a wiring layer 13 formed on a surface of the base 12. The wiring layer 13 has a copper plating plate 14 formed on the base 12 and a silver plating layer 16 formed on the copper plating plate 14. The wiring layer 13 is electrically connected to an electrode of the blue LED 30 to apply a voltage to the electrode of the blue LED 30. The wiring layer 13 has a first portion 13a that is electrically connected to a first electrode 30a of the blue LED 30 and a second portion 13b that is electrically connected to a second electrode 30b. The first portion 13b and the second portion 13a are separated from each other and are electrically insulated from each other. In a gap between the first portion 13a and the second portion 13b, an insulating portion 17 made of a resin or ceramic may be formed according to necessity.

Figure 4:
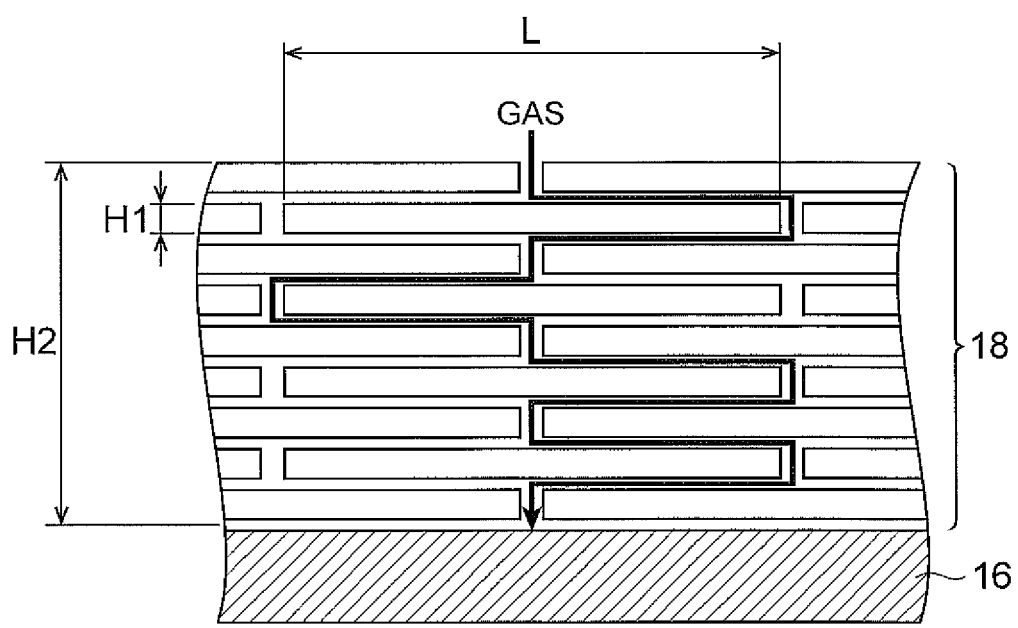
FIG. 4 is a schematic diagram illustrating a cross section of a clay film.

The optical semiconductor device 1A has a clay film 18 that covers the silver plating layer 16. The clay film 18 is a gas barrier that covers the silver plating layer 16 to suppress the sulfuration of the silver plating layer 16. In the clay film 18, both natural clay and synthetic clay can be used. For example, at least one of stevensite, hectorite, saponite, montmorillonite, and beidellite can be used. FIG. 4 is a schematic diagram illustrating a cross section of the clay film 18. As illustrated in FIG. 4, in the montmorillonite of the natural clay, a thickness H1 is equal to or less than 1 nm and a length L in a direction orthogonal to the thickness H1 is 10 nm to 1000 nm. As such, in the montmorillonite of the natural clay, because an aspect ratio is large, a path route until gas passes through the clay film 18 and arrives at the silver plating layer 16 is lengthened. Therefore, the sulfuration of the silver plating layer 16 can be suppressed.

A thickness H2 of the clay film 18 is preferably 0.01 μm to 500 μm, from the viewpoint of a gas barrier and a light transmitting property, is preferably 0.03 μm to 500 μm, and is more preferably 0.05 μm to 100 μm. In addition, the thickness H2 of the clay film 18 is preferably 0.05 μm to 10 μm and is further preferably 0.05 μm to 1 μm. The thickness H2 of the clay film 18 is set to 0.01 μm to 500 μm, so that both the gas barrier property for the silver plating layer 16 and transparency of the clay film 18 can be realized. In this case, the thickness H2 of the clay film 18 is set to 0.03 μm to 500 μm, 0.05 μm to 100 μm, 0.05 μm to 10 μm, and 0.05 μm to 1 μm, so that the effect can be further improved.

The thickness H2 of the clay film 18 is preferably equal to or less than 500 μm, from the viewpoint of wire bonding, and is further preferably 0.01 μm to 500 μm. By setting the thickness to such a range, superior wire bonding can be secured.

The blue LED 30 is a light source of the optical semiconductor device 1A. Referring to FIG. 1, the first electrode 30a of the blue LED 30 is die-bonded to the first portion 13a of the wiring layer 13 by a die bond material 32 having conductivity. In addition, the second electrode 30b of the blue LED 30 is connected to the second portion 13b of the wiring layer 13 by the bonding wire 34.

The reflector 20 reflects light generated by the blue LED 30 on the outside of the optical semiconductor device 1A. The reflector 20 is erected from the surface of the substrate 10 to surround the blue LED 30 and forms the internal space 22 storing the blue LED 30. A transparent sealing resin 40 to seal the blue LED 30 is filled into the internal space 22.

The reflector 20 is made of a thermosetting resin containing a white pigment. As the thermosetting resin, resins in which pressurization molding is enabled at a room temperature (for example, 25° C.) are used to easily form the reflector 20. Particularly, an epoxy resin is preferable from the viewpoint of adhesiveness. For example, the epoxy resin, a silicon resin, and a urethane resin can be used as the resin. As the white pigment, alumina, magnesium oxide, antimony oxide, titanium oxide, or zirconium oxide can be used, for example. Particularly, the titanium oxide is preferable from the viewpoint of a light reflecting property.

The transparent sealing resin 40 seals the blue LED 30 and is filled into the internal space 22 formed by the reflector 20. As the resin filled into the internal space 22, resins that can transmit light of a wavelength band including at least a wavelength of light emitted from the blue LED 30 are used. As the transparent sealing resin 40, a silicon resin or an acrylic resin is preferably adopted, from the viewpoint of transparency. The transparent sealing resin 40 may further include an inorganic filling material diffusing light or a fluorescent material 42 generating white light from the optical semiconductor device 1A using the light generated from the blue LED 30 as excitation light.

The optical semiconductor device 1A according to the first embodiment includes the bonding wire 34 that electrically connects the second electrode 30b of the blue LED 30 and the silver plating layer 16 of the wiring layer 13. The bonding wire 34 has a first connecting portion 35 that is bonded to the second electrode 30b of the blue LED 30, a second connecting portion 36 that is bonded to the silver plating layer 16, and an extension portion 37 that extends from the first connecting portion 35 to the second connecting portion 36. As the bonding wire 34, wire made of gold, copper, or aluminum having a diameter of 5 μm to 40 μm can be used.

Because the first connecting portion 35 is connected to the second electrode 30b of the blue LED 30 contacting the transparent sealing resin 40, the first connecting portion 35 also contacts the transparent sealing resin 40. In addition, a part of the first connecting portion 35 is exposed from the clay film 18 without contacting the clay film 18 and the clay film 18 is not attached to the part of the first connecting portion 35 exposed from the clay film 18.

As illustrated in FIG. 2, the second connecting portion 36 has a connection surface 36a that contacts a surface 16a of the silver plating layer 16 and an exposure surface 36b that exists at the side opposite to the connection surface 36a. The surface 16a of the silver plating layer 16 and the connection surface 36a of the bonding wire 34 contact each other, so that conduction of the silver plating layer 16 and the bonding wire 34 is secured. The connection surface 36a and the surface 16a of the silver plating layer 16 may be connected such that conduction of the bonding wire 34 and the silver plating layer 16 is secured. For this reason, an entire surface of the connection surface 36a may contact the surface 16a of the silver plating layer 16 and a part of the connection surface 36a may contact the surface 16a of the silver plating layer 16. For example, a part of the clay film 18 may be sandwiched between the connection surface 36a and the surface 16a of the silver plating layer 16. In addition, a part or an entire portion of a lateral portion between the connection surface 36a and the exposure surface 36b in the second connecting portion 36 is surrounded with the clay film 18. The entire surface of the exposure surface 36b is exposed from the clay film 18 without contacting the clay film 18 and the clay film 18 is not attached to the exposure surface 36b exposed from the clay film 18.

The extension portion 37 forms a wire loop in the transparent sealing resin 40. For this reason, an entire surface of a lateral surface of the extension portion 37 contacts the transparent sealing resin 40. In addition, the entire portion of the extension portion 37 is exposed from the clay film 18 without contacting the clay film 18 and the clay film 18 is not attached to the extension portion 37 exposed from the clay film 18.

As such, in the optical semiconductor device 1A according to this embodiment, because the surface 16a of the silver plating layer 16 is covered with the clay film 18 having the gas barrier, the sulfuration of the silver plating layer 16 can be suppressed. Thereby, the illuminance of the optical semiconductor device 1A can be suppressed from being decreased due to the color change of the silver plating layer 16.

In addition, in the optical semiconductor device 1A according to this embodiment, the bonding wire 34 is fixed to the silver plating layer 16 by the wire bonding and the connection surface 36a of the second connecting portion 36 contacts the surface 16a of the silver plating layer 16. Thereby, conduction can be secured between the bonding wire 34 and the silver plating layer 16.

In addition, in the optical semiconductor device 1A according to this embodiment, the first connecting portion 35, the exposure surface 36b, and the extension portion 37 of the bonding wire 34 contact the transparent sealing resin 40 and the clay film 18 is not attached, unnecessary stress can be prevented from being applied from the clay film 18 to the bonding wire 34. Therefore, fracturing of the bonding wire 34 can be prevented.

Figure 5:
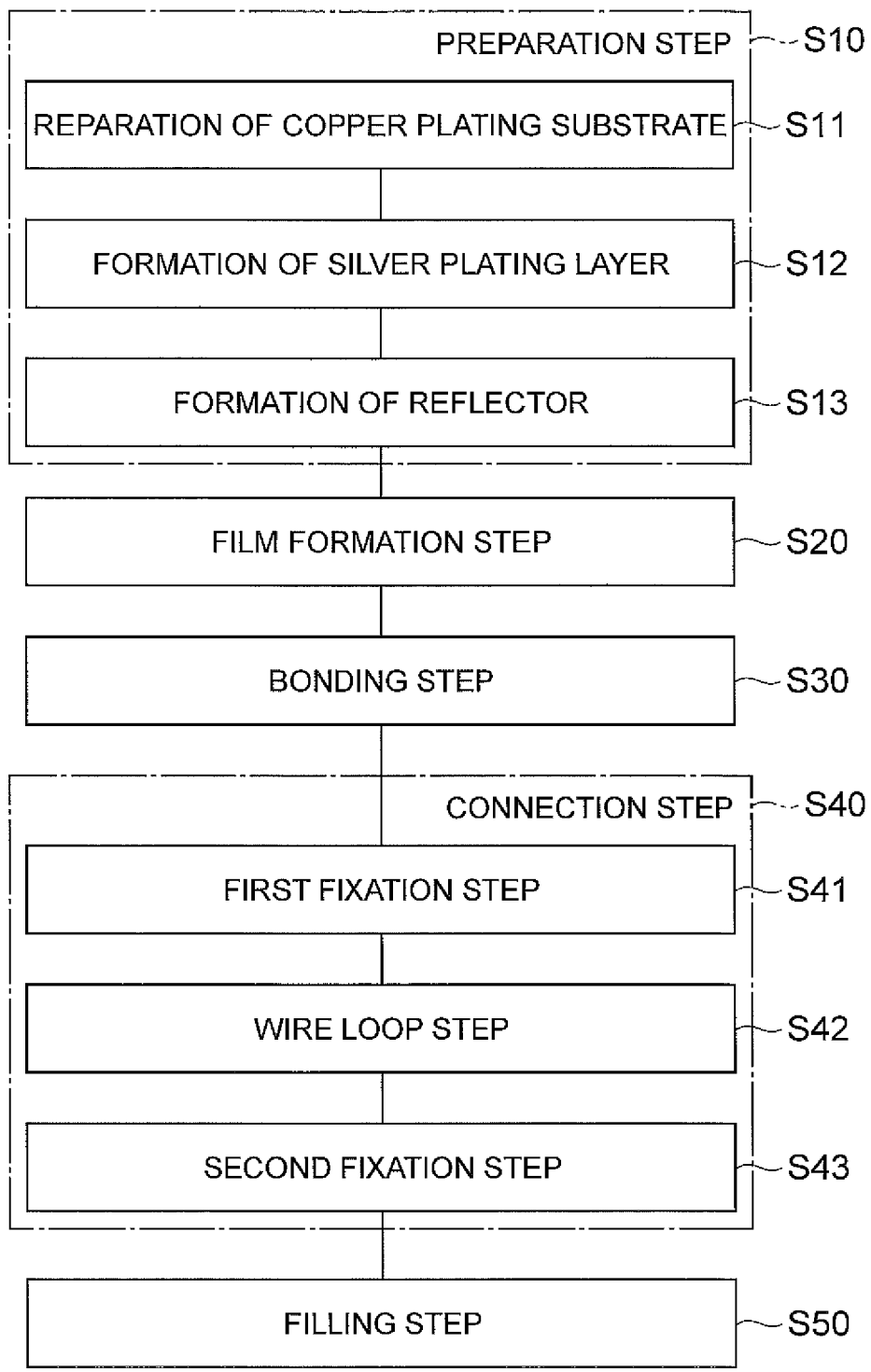
FIG. 5 is a flowchart illustrating a production method for the optical semiconductor device according to the first embodiment.

Referring to FIG. 5, a production method for the optical semiconductor device 1A will be described. As illustrated in FIG. 5, the production method for the optical semiconductor device 1A includes a preparation step S10, a film formation step S20 of forming the clay film 18 to cover the silver plating layer 16, a bonding step S30 of fixing the blue LED 30, a connection step S40 of electrically connecting the silver plating layer 16 covered with the clay film 18 and the blue LED 30 by the wire bonding, and a filling step S50 of filling the transparent sealing resin 40 to be the light transmitting resin into the internal space 22 of the reflector 20.

In the preparation step S10, a product including the substrate 10 having the silver plating layer 16 formed on the surface and the reflector 20 fixed to the substrate 10 is prepared. First, the substrate having the copper plating plate 14 provided on the base 12 is prepared (step S11). Next, the silver plating layer 16 is formed on the copper plating plate 14 (step S12). In addition, the reflector 20 is fixed on the silver plating layer 16 (step S13).

After the preparation step S10, the film formation step S20 is executed. First, a clay diluted solution obtained by diluting the clay with a solvent is prepared. First, powdery montmorillonite is mixed with super pure water and a semitransparent solution is prepared and stirred. Next, isopropyl alcohol is introduced into the semitransparent solution after the stirring and the stirring is further performed, so that the clay diluted solution is prepared. A ratio of the water and the isopropyl alcohol in the solvent is 9:1, for example. The isopropyl alcohol is introduced as the solvent, so that irregularities of the clay film 18 occurring when the clay diluted solution is dried can be suppressed and the thickness H2 of the clay film 18 can be almost equalized. Next, the clay diluted solution is applied to the internal space 22 of the reflector 20. In this embodiment, the clay diluted solution is dropped or sprayed on the internal space 22, so that the clay diluted solution is applied to the internal space 22. At this time, a drop amount or a spray amount is adjusted such that the clay diluted solution covers the entire surface of the silver plating layer 16 exposed to the internal space 22. In addition, the solvent of the clay diluted solution is dried. For example, the product to which the clay diluted solution is applied is exposed to an environment of 70° C. for five minutes and the product is dried. By the steps described above, the clay film 18 is formed on an entire region covered with the clay diluted solution.

Because the thickness H2 of the clay film 18 according to this embodiment is 0.01 μm to 500 μm, the clay film 18 has a light transmitting property. For this reason, the clay film 18 may be formed on a region other than the silver plating layer 16 exposed to the internal space 22. For example, the clay film 18 may be formed on an inner wall surface 20a of the reflector 20. Thereby, the clay diluted solution of an amount in which the silver plating layer 16 can be surely covered with the clay film 18 can be applied. Therefore, it is not necessary to adjust an application amount of the clay diluted solution to cover only the silver plating layer 16 and the application amount of the clay diluted solution may be adjusted to be more than an amount in which the clay film 18 can be formed on at least the silver plating layer 16. As a result, the clay film 18 may be easily formed.

After the film formation step S20, the bonding step S30 is executed. In the bonding step S30, the blue LED 30 is fixed on the silver plating layer 16 with the conductive die bond material 32 therebetween. By this step, the first electrode 30a of the blue LED 30 and the first portion 13a of the wiring layer 13 are electrically connected to each other.

After the bonding step S30, the connection step S40 is executed. The connection step S40 has a first fixation step S41, a wire loop step S42, and a second fixation step S43. As a wire bonding device used in the connection step S40, a known wire bonding device can be used. The wire bonding device includes a capillary (not illustrated in the drawings) into which the bonding wire 34 is inserted. After the capillary is moved to a predetermined position, the capillary is descended, the bonding wire 34 is pushed against the electrode of the blue LED 30 or the silver plating layer 16 provided with the clay film 18, so that the bonding wire 34 is fixed. By this step, the bonding wire 34 and the second electrode 30b of the blue LED 30 are electrically connected to each other.

In the first fixation step S41, the first connecting portion 35 is formed and the bonding wire 34 is fixed to the second electrode 30b of the blue LED 30. In the first fixation step S41, a method of any one of ball bonding and wedge bonding is used. In this embodiment, because the clay film 18 is not formed on the surface of the blue LED 30, the bonding wire 34 can be fixed to the second electrode 30b of the blue LED 30 according to known conditions. Next, the wire loop step S42 is executed. In the wire loop step S42, the capillary is moved while the bonding wire 34 is fed and a wire loop is formed (refer to FIG. 1).

In the second fixation step S43, the second connecting portion 36 is formed and the bonding wire 34 is fixed to the silver plating layer 16. First, the bonding wire 34 after forming the wire loop is arranged on the clay film 18 and is pressed to the silver plating layer 16. At this time, a load of 60 gf to 150 gf is preferably applied to the capillary. If the load is applied, the bonding wire 34 is made to penetrate the clay film 18, so that the bonding wire 34 can be surely connected to the silver plating layer 16. In addition, the capillary is preferably vibrated at a frequency band of 80 kHz to 160 kHz to be an ultrasonic band, when the load is applied. By the application of the vibration, the bonding wire 34 is made to penetrate the clay film 18, so that the bonding wire 34 can be more surely connected to the silver plating layer 16. After the bonding wire 34 is fixed to the silver plating layer 16, in a state in which the capillary holds the bonding wire 34, the capillary is raised and a tail of the bonding wire 34 is cut. By this step, the bonding wire 34 and the second portion 13b of the wiring layer 13 are electrically connected to each other.

Next, the filling step S50 is executed. In the filling step S50, the transparent sealing resin 40 is filled into the internal space 22 of the reflector 20 and the blue LED 30 and the first connecting portion 35, the second connecting portion 36, and the extension portion 37 of the bonding wire 34 are sealed by the resin. By the steps described above, the optical semiconductor device 1A is produced.

As such, according to the production method for the optical semiconductor device 1A according to this embodiment, in the film formation step S20, because the silver plating layer 16 is covered with the clay film 18 having the gas barrier property, the sulfuration of the silver plating layer 16 can be suppressed. Thereby, the illuminance of the optical semiconductor device 1A can be suppressed from being decreased due to the color change of the silver plating layer 16.

In addition, according to the production method for the optical semiconductor device 1A according to this embodiment, in the connection step S40, the wire bonding is performed, so that the bonding wire 34 having penetrated the clay film 18 can be electrically connected to the silver plating layer 16 and conduction of the silver plating layer 16 and the blue LED 30 can be secured.

Figure 6:
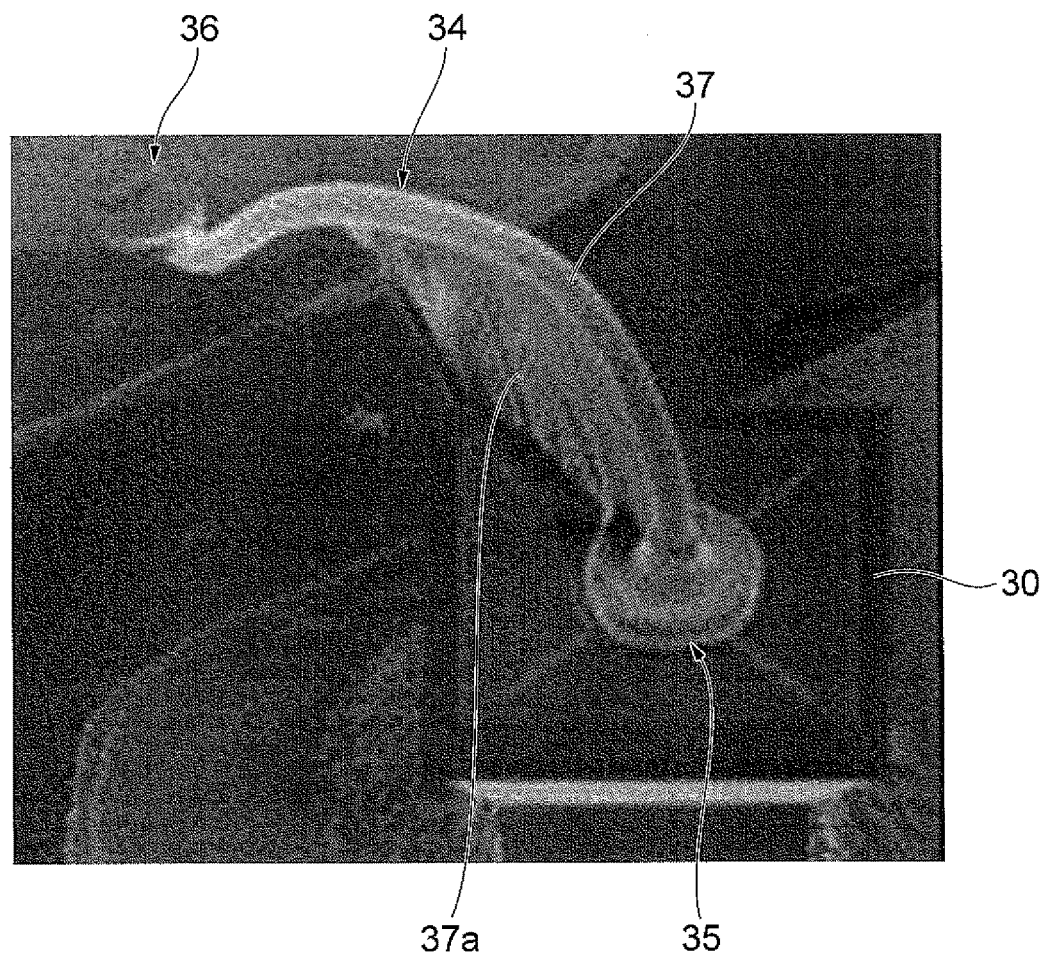
FIG. 6 is a diagram illustrating an effect of the production method for the optical semiconductor device according to the first embodiment.

Meanwhile, FIG. 6 is a partially enlarged SEM image of an optical semiconductor device that is produced by a production method according to a comparative example. In the production method according to this embodiment, the connection step S40 is executed after the film formation step S20 is executed. However, the production method according to the comparative example is different from the production method according to this embodiment in that the film formation step S20 is executed after the connection step S40 is executed. That is, in the production method according to the comparative example, the bonding wire 34 connected to the blue LED 30 and the silver plating layer 16 exists when the film formation step S20 is executed. In this state, when the clay diluted solution is applied to the silver plating layer 16, the clay diluted solution is also attached to the bonding wire 34. In addition, if the clay diluted solution is dried in a state in which the clay diluted solution is attached to the extension portion 37, as illustrated in FIG. 6, the clay film is attached to the extension portion 37 of the bonding wire 34 and a clay film 37a attached to the extension portion 37 may be spread in a curtain shape according to a composition or a concentration of the clay diluted solution. Because the clay film 37a attached to the extension portion 37 applies the unnecessary stress to the bonding wire 34, the bonding wire 34 may be fractured.

Meanwhile, according to the production method for the optical semiconductor device 1A according to this embodiment, because the film formation step S20 is executed before the connection step S40, the clay diluted solution is not attached to the bonding wire 34 and the clay film 18 can be prevented from being attached to the bonding wire 34. Therefore, the unnecessary stress can be prevented from being applied from the clay film 18 to the bonding wire 34 and the fracturing of the bonding wire 34 can be suppressed.

In addition, according to the production method for the optical semiconductor device 1A according to this embodiment, because the film formation step S20 is executed in a state in which the bonding wire 34 does not exist, the clay film 18 can be surely formed on the silver plating layer 16.

In addition, according to the production method for the optical semiconductor device 1A according to this embodiment, the clay film 18 is formed using the clay diluted solution. Because the clay diluted solution can adjust the application amount for the substrate 10 and the ratio of the clay for the solvent, the clay film 18 is formed using the clay diluted solution, so that the thickness H2 of the clay film 18 can be controlled. Thereby, the clay film 18 having the predetermined thickness H2 can be easily formed.

In addition, according to the production method for the optical semiconductor device 1A according to this embodiment, the bonding step S30 is executed between the film formation step S20 and the connection step S40. According to the order of these steps, because the clay film 18 is not formed on the surface of the blue LED 30, bonding of the bonding wire 34 can be easily executed for the second electrode 30b of the blue LED 30.

Second Embodiment

Figure 7:
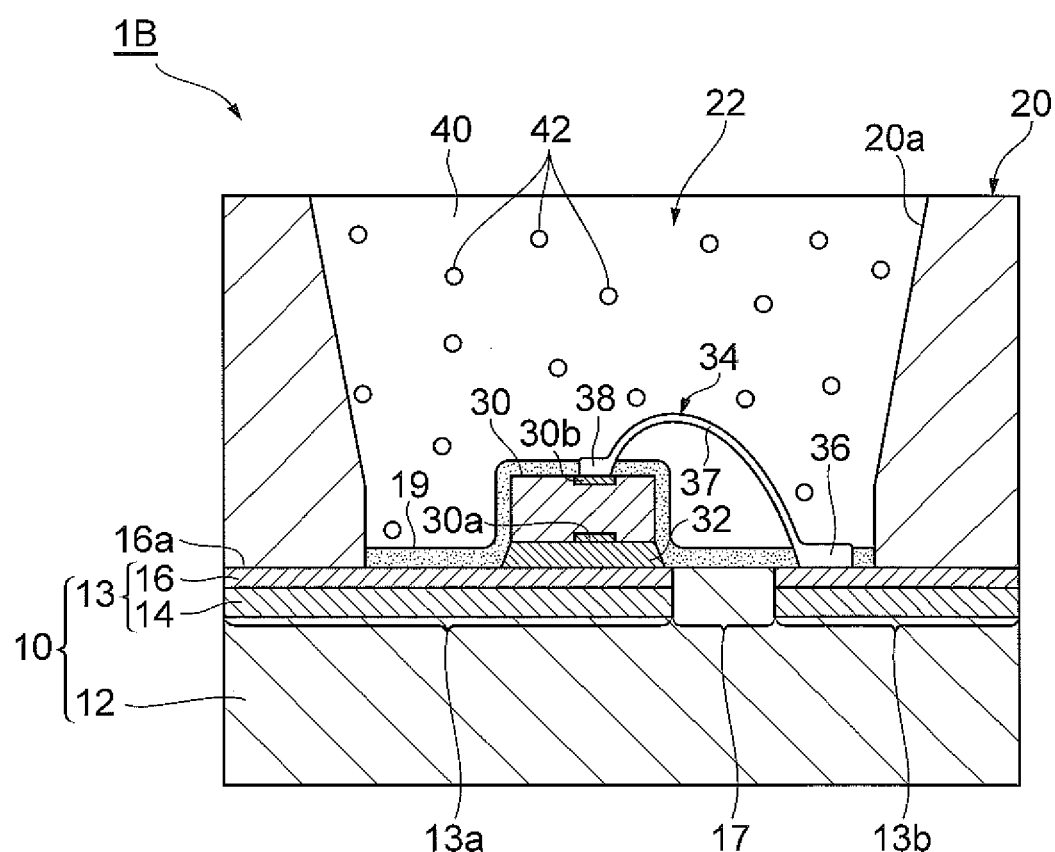
FIG. 7 is a diagram illustrating a cross section of an optical semiconductor device according to a second embodiment.
Figure 8:
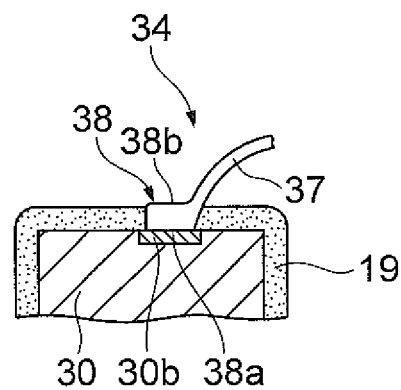
FIG. 8 is a diagram illustrating a partially enlarged cross section of the optical semiconductor device illustrated in FIG. 7.

Next, an optical semiconductor device according to a second embodiment will be described. FIG. 7 is a diagram illustrating a cross section of the optical semiconductor device according to the second embodiment. FIG. 8 is a partially enlarged view of FIG. 7. An optical semiconductor device 1B according to the second embodiment is different from the optical semiconductor device 1A according to the first embodiment in that a clay film 19 covering a surface 16a of a silver plating layer 16 and a surface of a blue LED 30 and bonding wire 34 having a first connecting portion 38 penetrating the clay film 19 and fixed to a second electrode 30b of the blue LED 30 are provided. The other configuration is the same as that of the optical semiconductor device 1A.

The optical semiconductor device 1B has the clay film 19 that covers the silver plating layer 16 and covers the blue LED 30. The clay film 19 has the same configuration as that of a clay film 18, except that the clay film 19 is formed on the surface and lateral surfaces of the blue LED 30.

The optical semiconductor device 1B includes the bonding wire 34 that electrically connects the second electrode 30b of the blue LED 30 and the silver plating layer 16 of a wiring layer 13. The bonding wire 34 has the first connecting portion 38 bonded to the second electrode 30b of the blue LED 30, a second connecting portion 36 bonded to the silver plating layer 16, and an extension portion 37 extending from the first connecting portion 35 to the second connecting portion 36.

As illustrated in FIG. 8, the first connecting portion 38 is connected to the second electrode 30b of the blue LED 30 provided with the clay film 19. The first connecting portion 38 has a connection surface 38a that contacts the second electrode 30b of the blue LED 30 and an exposure surface 38b that exists at the side opposite to the connection surface 38a. The second electrode 30b and the connection surface 38a contact each other, so that conduction of the second electrode 30b of the blue LED 30 and the bonding wire 34 is secured. The connection surface 38a and the second electrode 30b may be connected to each other, such that conduction of the bonding wire 34 and the second electrode 30b is secured. For this reason, an entire surface of the connection surface 38a may contact the second electrode 30b and a part of the connection surface 38a may contact the second electrode 30b. For example, a part of the clay film 19 may be sandwiched between the connection surface 38a and the second electrode 30b. In addition, a part or an entire portion of a lateral portion between the connection surface 38a and the exposure surface 38b in the first connecting portion 38 is surrounded with the clay film 19. An entire surface of the exposure surface 38b is exposed from the clay film 19 without contacting the clay film 19 and the clay film 19 is not attached to the exposure surface 38b.

Figure 9:
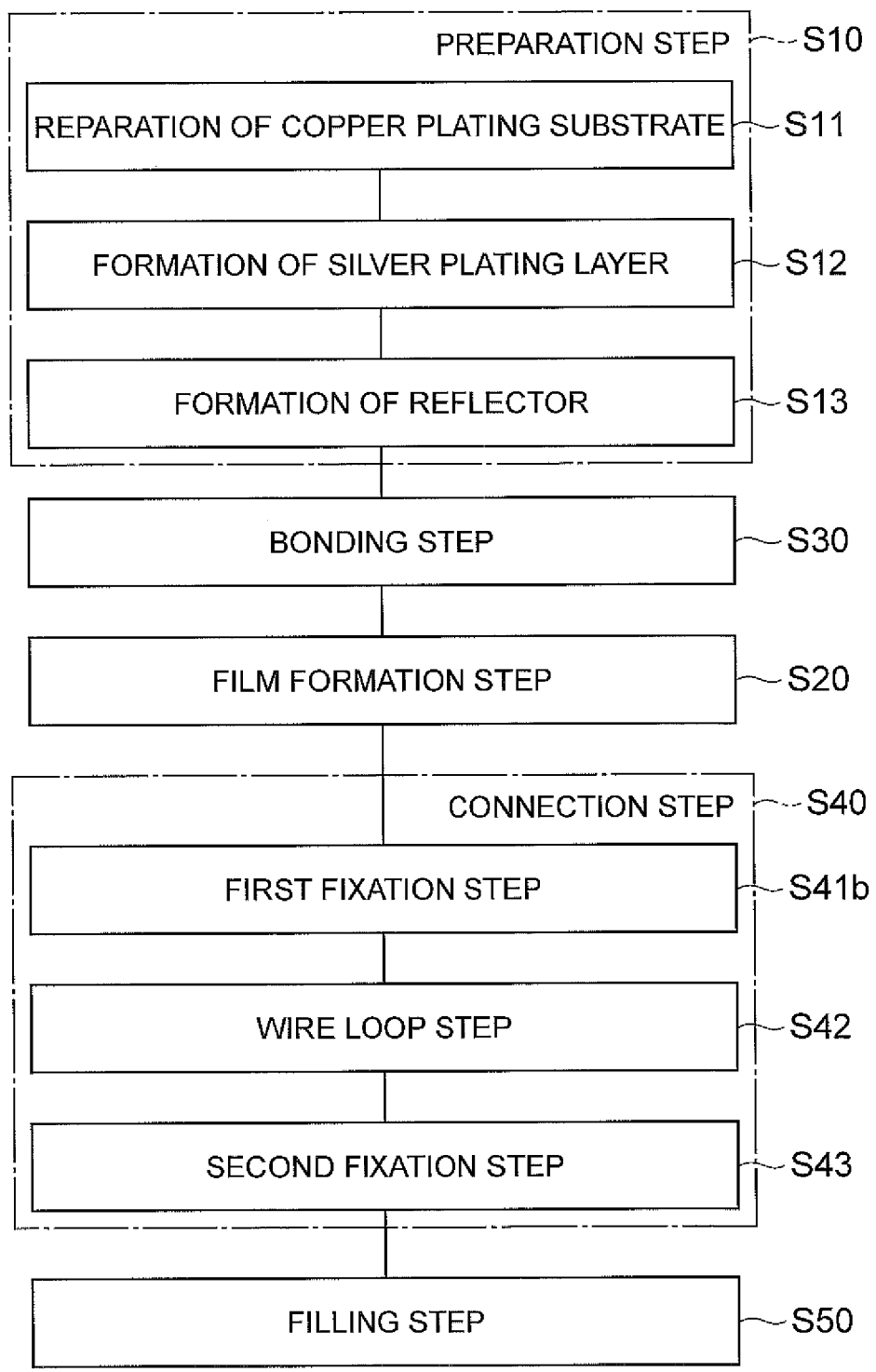
FIG. 9 is a flowchart illustrating a production method for the optical semiconductor device according to the second embodiment.

Next, a production method for the optical semiconductor device 1B according to the second embodiment will be described. FIG. 9 is a flowchart illustrating production steps of the optical semiconductor device 1B according to the second embodiment. As illustrated in FIG. 9, the production method according to the second embodiment is different from the production method for the optical semiconductor device 1A according to the first embodiment in that a bonding step S30 is executed before a film formation step S20. For this reason, in a first fixation step S41b, the bonding wire 34 is fixed to the second electrode 30b provided with the clay film 19. The other steps are the same as those of the production method according to the first embodiment. Bonding conditions in the first fixation step S41b are the same as bonding conditions when the bonding wire 34 is fixed to the silver plating layer 16 provided with the clay film 19 in a second fixation step S43.

According to the production method for the optical semiconductor device 1B according to the second embodiment, the clay film 18 does not exist on the surface 16a of the silver plating layer 16 when the bonding step S30 is executed. Therefore, the blue LED 30 can be easily bonded to the silver plating layer 16.

The preferred embodiments of one aspect of the present invention have been described. However, the present invention is not limited to the embodiments described above.

For example, in the embodiments, the blue LED is adopted as the light emitting diode. However, a light emitting diode that generates light other than blue light may be adopted.

EXAMPLE

Next, examples of the present invention will be described. However, the present invention is not limited to the following examples.

First Example

In a first example, it was confirmed whether bonding wire penetrating a clay layer and fixed to a silver plating layer was mechanically and electrically connected. In the first example, a test specimen which included a first test piece and a second test piece where a clay film was formed on the silver plating layer and in which the test pieces were electrically insulated from each other was prepared. In each test piece according the first example, a clay diluted solution was dropped on the silver plating layer five times and the clay film having the thickness of 700 nm was formed. In addition, one end of the bonding wire was bonded to the first test piece and the other end of the bonding wire was bonded to the second test piece. According to execution conditions of wire bonding, a load applied to a capillary was set as 80 gf and a frequency to vibrate the capillary was set as 120 kHz. In the first example, wire that had a diameter of 25 μm and was manufactured by Tanaka Denshi Kogyo K.K. (SR-25) was used.

In the mechanical connection of the bonding wire and the silver plating layer, a tension test was carried out and a tension load when the bonding wire was removed from each test piece was evaluated as the pull strength. In the tension test, a hook was moved to an upper side after the hook was hooked to an extension portion and the tension load was applied to the bonding wire. In addition, in the electrical connection of the bonding wire and the silver plating layer, conduction resistance between the first test piece and the second test piece was measured and evaluated. As a result, the pull strength was 5.2 gf and the conduction resistance was 0.2Ω, as illustrated in FIG. 10.

Second Example

In a second example, conditions were the same as those in the first example, except that a clay diluted solution was dropped on a silver plating layer ten times and a clay film having a thickness of 1800 nm was formed. In addition, the same evaluation as that of the first example was performed. As a result, the pull strength was 5.8 gf and the conduction resistance was 0.3Ω, as illustrated in FIG. 10.

Comparative Example

In a comparative example, conditions were the same as those in the first example, except that a clay film was not formed on a silver plating layer. In addition, the same evaluation as that of the first example was performed. As a result, the pull strength was 7.7 gf and the conduction resistance was 0.2Ω, as illustrated in FIG. 10.

From the results described above, it was confirmed that the bonding wire was mechanically and electrically connected to the silver plating layer covered with the clay film, without causing a problem. In addition, it was confirmed that there was no significant disparity in the pull strength and the conduction resistance, in the case (first and second examples) in which the bonding wire penetrated the clay film and was fixed to the silver plating layer and the case (comparative example) in which the bonding wire was fixed to the silver plating layer not provided with the clay film.

Third Example

Next, in a third example, a state of a cross section of a second connecting portion penetrating a clay film and wire-bonded to a silver plating layer was confirmed. FIGS. 11 to 15 are SEM images of the second connecting portion. First, a test specimen in which a thickness of the clay film formed on the silver plating layer is 3 μm was prepared. According to execution conditions of wire bonding, a load applied to a capillary was set as 80 gf and a frequency to vibrate the capillary was set as 120 kHz (refer to an (a) portion of FIG. 11). In the third example, wire that had a diameter of 25 μm and was made of gold was used. Next, focused ion beam processing (FIB processing) was executed on the second connecting portion and the cross section of the second connecting portion was formed (refer to a (b) portion of FIG. 11).

Figure 11:
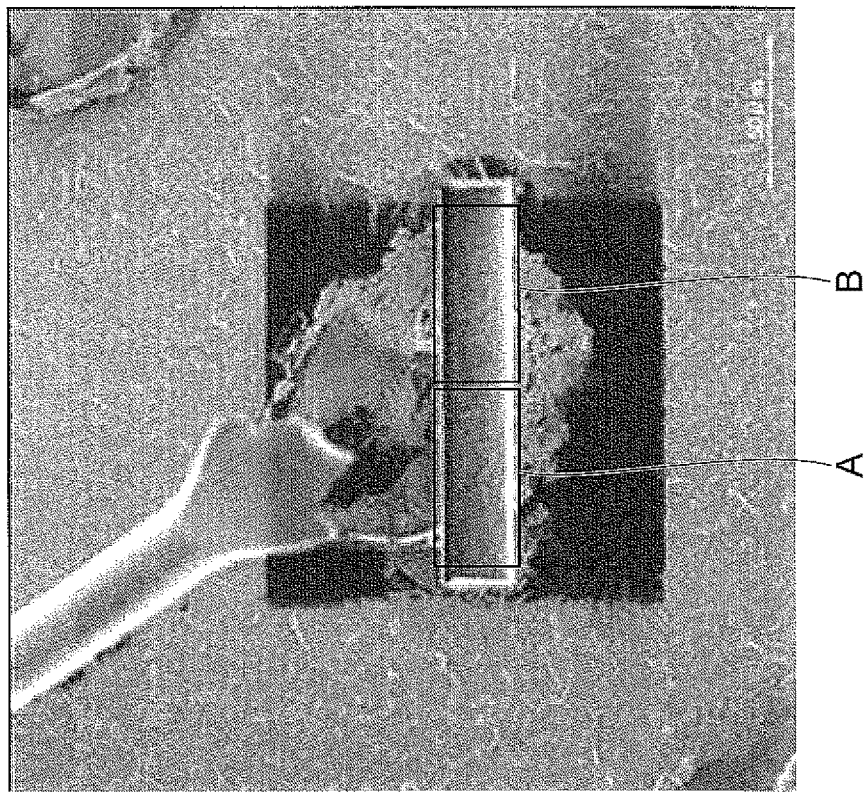
FIG. 11 is an SEM image obtained by imaging a second connecting portion.
Figure 11:
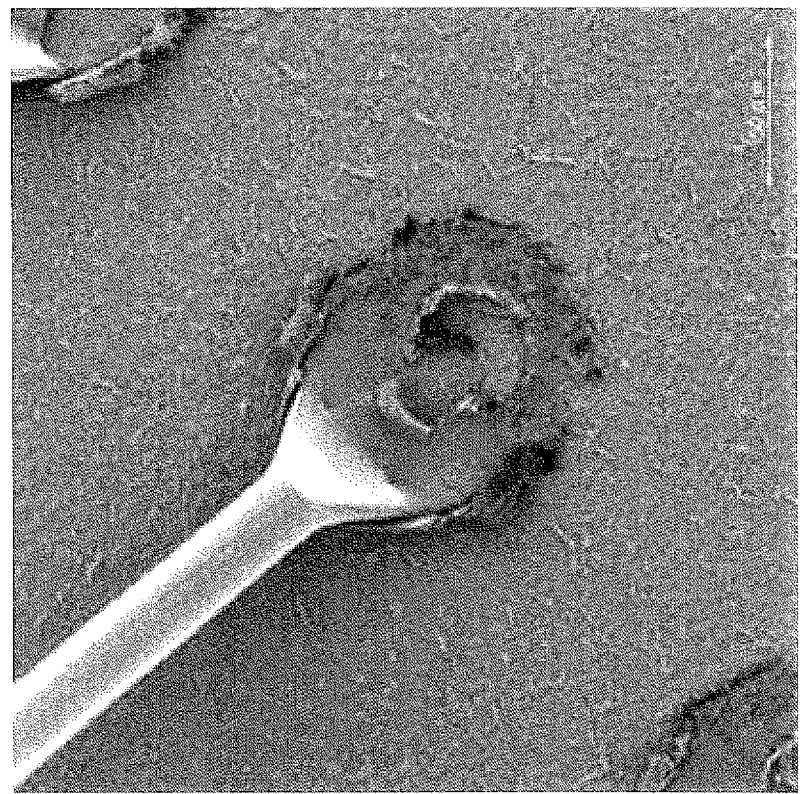
Figure 12:
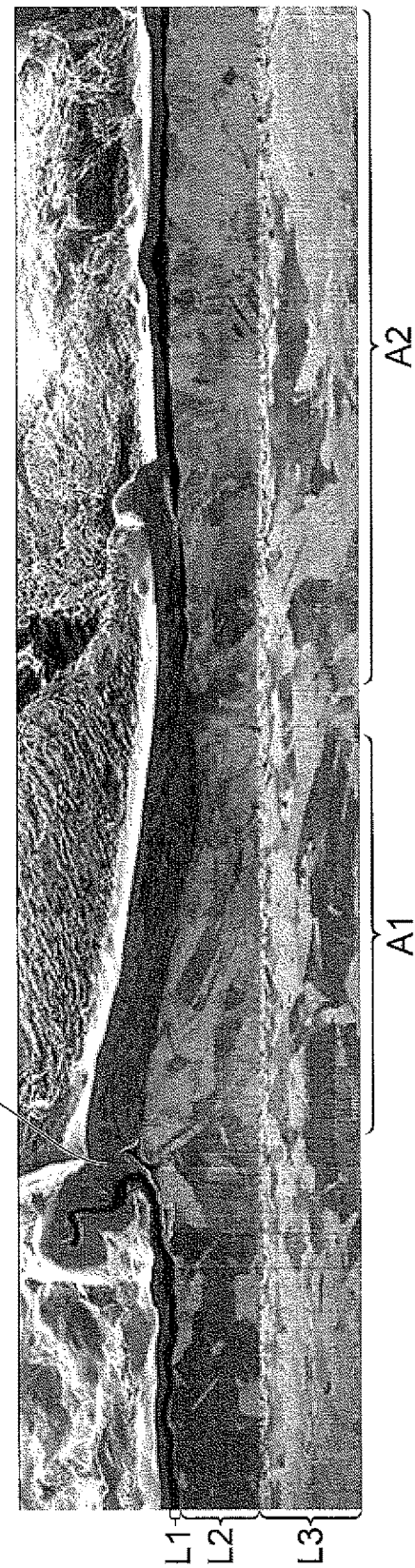
FIG. 12 is an enlarged SEM image of an A portion illustrated in FIG. 11.

FIG. 12 is an enlarged SEM image of a region A of (b) of FIG. 11. A layer L1 is a copper plating plate and a layer L2 is a silver plating layer. In addition, a layer L3 is a clay film. When the region A1 was confirmed, it was known that bonding wire W and the silver plating layer L2 directly contacted each other. Meanwhile, when a region A2 was confirmed, it was known that the clay film L3 remained between the bonding wire W and the silver plating layer L2.

Figure 13:
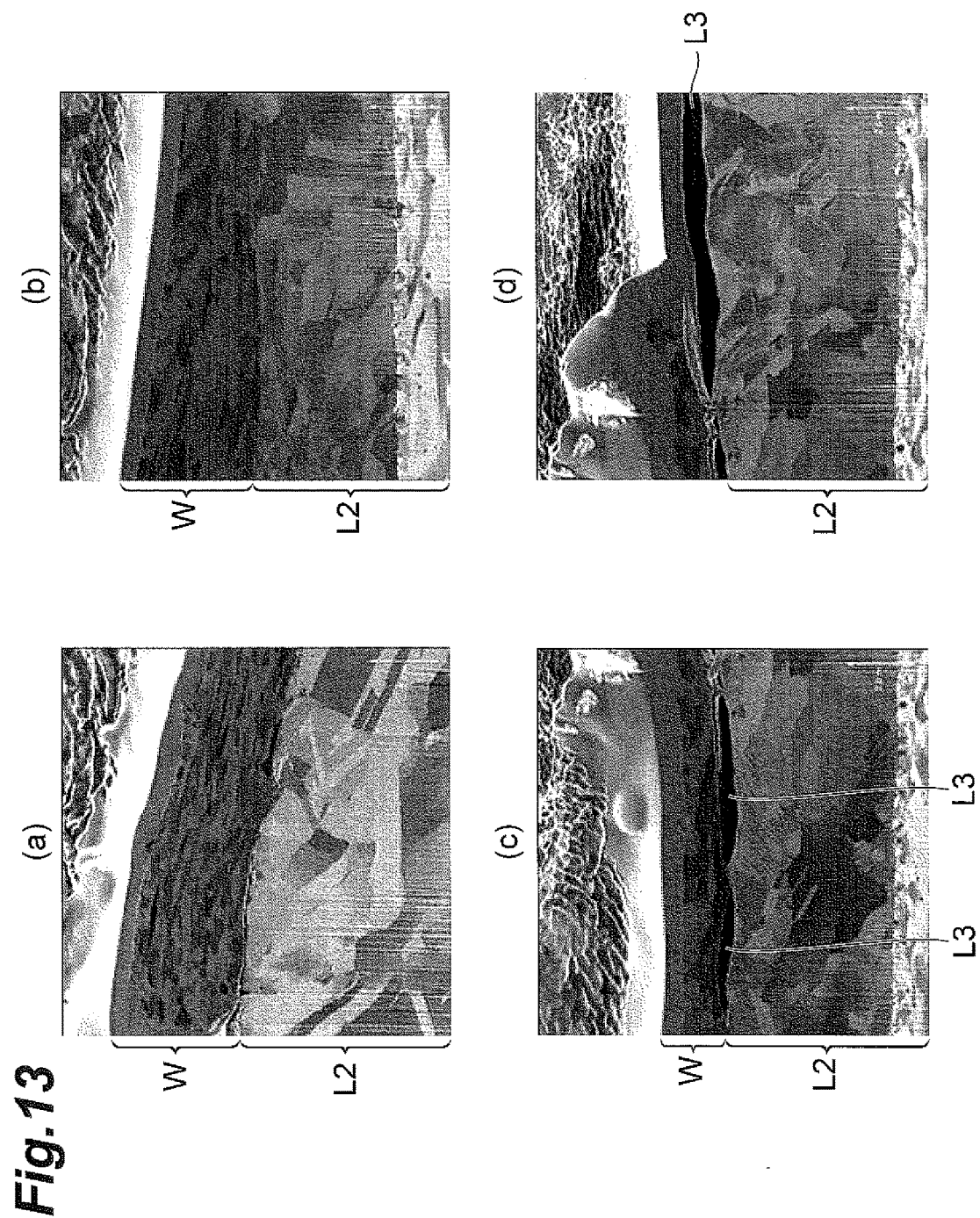
FIG. 13 is a partially enlarged SEM image of a cross section illustrated in FIG. 12.

An (a) portion of FIG. 13 and a (b) portion of FIG. 13 are further enlarged SEM images of a part of the region A1 illustrated in FIG. 12. An (c) portion of FIG. 13 and a (d) portion of FIG. 13 are further enlarged SEM images of a part of the region A2 illustrated in FIG. 12. According to the SEM image of the (a) portion of FIG. 13, it was confirmed that the clay film L3 did not exist between the silver plating layer L2 and the bonding wire W and a contact surface of the bonding wire W was directly fixed to the silver plating layer. In addition, it was confirmed that crystal of the bonding wire W was slightly deformed. Similar to the SEM image of the (a) portion of FIG. 13, in the SEM image of the (b) portion of FIG. 13, it was confirmed that the clay film L3 did not exist between the silver plating layer L2 and the bonding wire W and the contact surface of the bonding wire W was directly fixed to the silver plating layer. In addition, it was confirmed that crystal of the bonding wire W was slightly deformed. Meanwhile, in the SEM image of the (c) portion of FIG. 13, it was confirmed that the clay film L3 existed between the bonding wire W and the silver plating layer L2. In this region, it was confirmed that the contact surface of the bonding wire W and the silver plating layer were partially fixed to each other. In addition, the deformation of the crystal of the bonding wire W was not confirmed. The SEM image of the (d) portion of FIG. 13 illustrates a cross section of about the center of the second connecting portion. For this reason, the bonding wire W was not confirmed.

Figure 14:
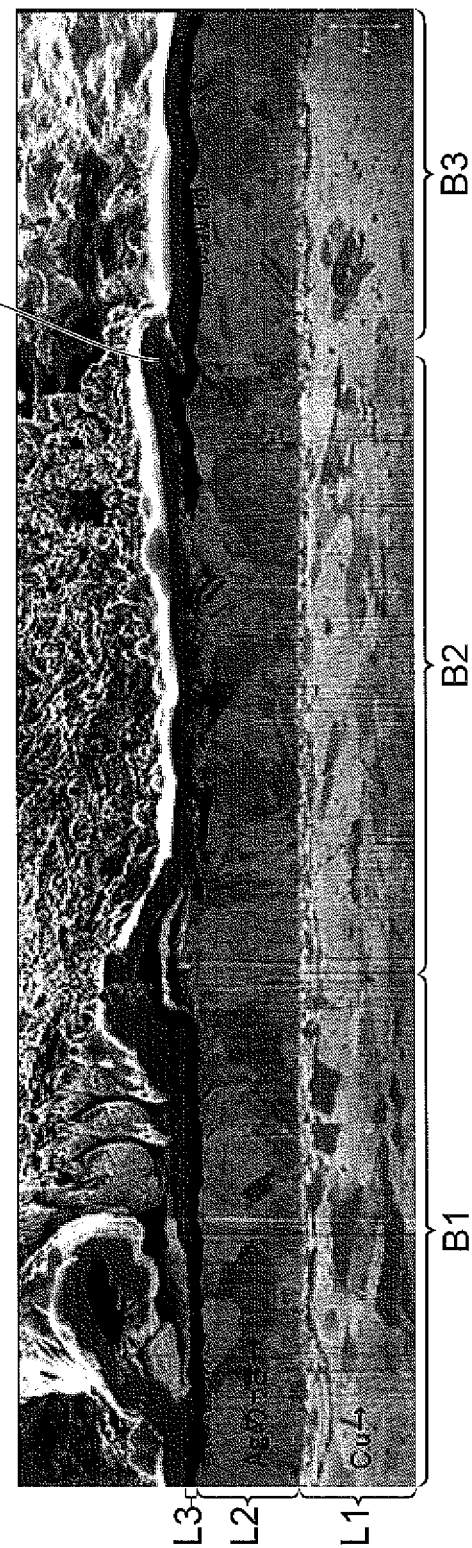
FIG. 14 is an enlarged SEM image of a B portion illustrated in FIG. 11.

FIG. 14 is an enlarged SEM image of a region B of the (b) portion of FIG. 11. A layer L1 is a copper plating plate and a layer L2 is a silver plating layer. In addition, a layer L3 is a clay film. When regions B1 and B3 were confirmed, it was known that the clay film L3 remained between the bonding wire W and the silver plating layer L2. Meanwhile, when a region B2 was confirmed, it was known that the bonding wire W and the silver plating layer L2 partially contacted each other.

Figure 15:
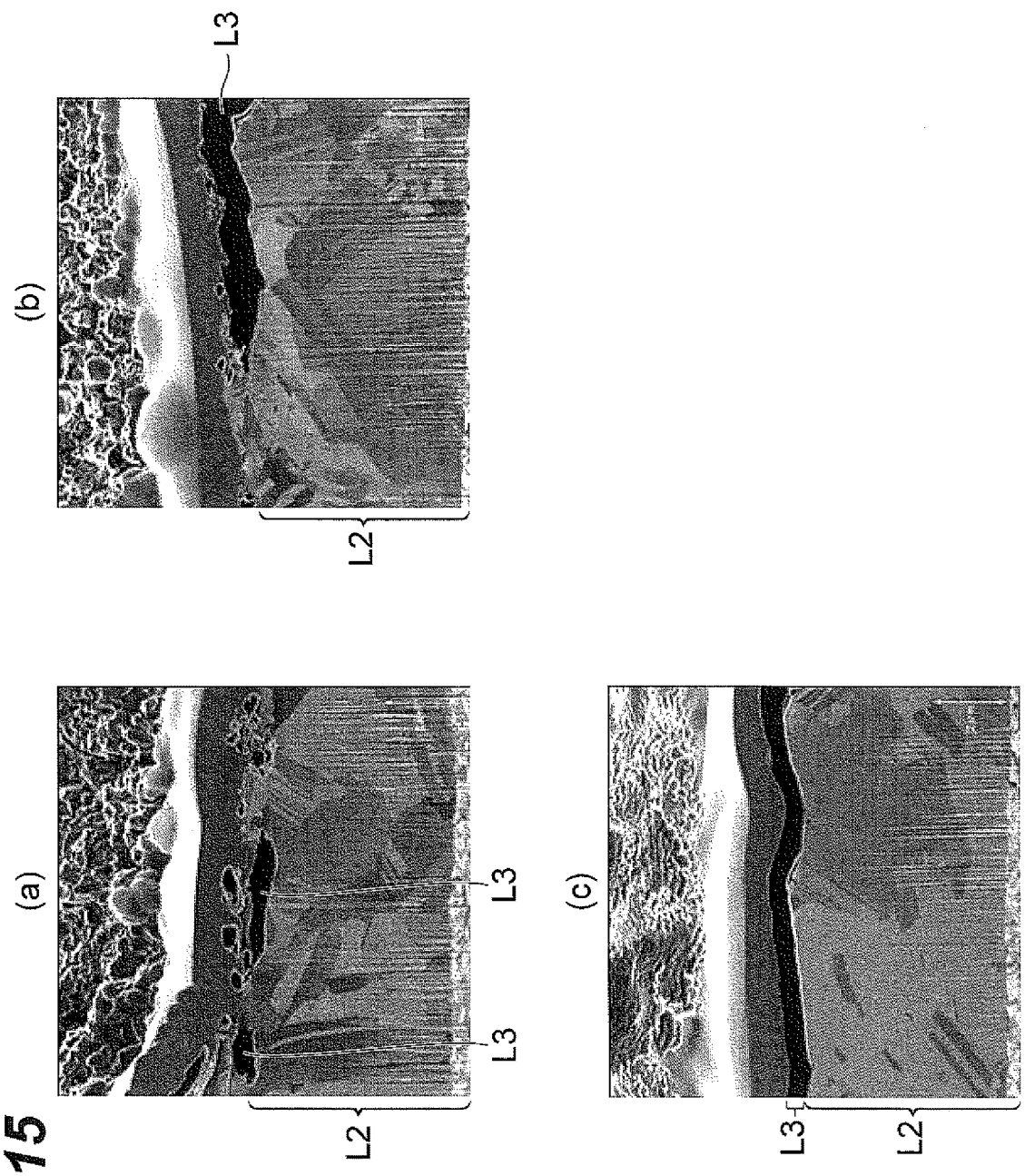
FIG. 15 is a partially enlarged SEM image of a cross section illustrated in FIG. 14.

An (a) portion of FIG. 15 is a further enlarged SEM image of a part of the region B1 illustrated in FIG. 14. A (b) portion of FIG. 15 is a further enlarged SEM image of a part of the region B2 illustrated in FIG. 14. A (c) portion of FIG. 15 is a further enlarged SEM image of a part of the region B3 illustrated in FIG. 14. According to the SEM image of the (a) portion of FIG. 15, slight bonding traces were confirmed, but existence of the bonding wire W was not confirmed. In addition, it was confirmed that the clay film was dotted. The SEM image of the (c) portion of FIG. 15 illustrates a cross section of a region where the bonding wire is not fixed. In the non-bonded region, it was confirmed that the clay film having the uniform thickness was formed.

According to the SEM images illustrated in FIGS. 11 to 15, it was known that the silver plating layer and the bonding wire were fixed to each other in a state in which the clay film was partially included.

REFERENCE SIGNS LIST 1A, 1B: optical semiconductor device
10: substrate
12: base
13: wiring layer
14: copper plating plate
16: silver plating layer
17: insulating portion
18, 19: clay film
20: reflector (light reflecting portion)
20a: inner wall surface
22: internal space
30: blue LED (light emitting diode)
32: die bond material
34: bonding wire
35, 38: first connecting portion
36: second connecting portion
36a, 38a: connection surface
36b, 38b: exposure surface
37: extension portion
40: transparent sealing resin (transparent sealing portion)
42: fluorescent material
S10: preparation step
S20: film formation step
S30: bonding step
S40: connection step
S50: filling step

The invention claimed is:

1. A production method for an optical semiconductor device including a substrate having a silver plating layer formed on a surface and a light emitting diode bonded to the silver plating layer, the production method comprising:
   a film formation step of forming a clay film covering the silver plating layer, wherein, in the film formation step, after a clay diluted solution obtained by diluting clay with a solvent from the surface side of the substrate is applied to the silver plating layer, the clay diluted solution is dried and the clay film is formed; and
   a connection step of electricity connection the light emitting diode and the silver plating layer covered with the clay film by wire bonding, after the film formation step.

2. The production method according to claim 1, further comprising:
   a bonding step of bonding the light emitting diode to the silver plating layer of the substrate, before the film formation step.

3. The production method according to claim 1, further comprising:

a bonding step of bonding the light emitting diode to the silver plating layer of the substrate, between the film formation step and the connection step.

4. The production method according to claim 1,
wherein a thickness of the clay film is 0.01 µm to 500 µm.

5. The production method according to claim 4,
wherein, in the connection step, a load applied to a capillary is set as 60 gf to 150 gf and bonding wire is pressed to the silver plating layer covered with the clay film.

6. The production method according to claim 5,
wherein, in the connection step, the capillary is vibrated and the bonding wire is pressed to the silver plating layer covered with the clay film.

* * * * *